(12) United States Patent
Meng et al.

(10) Patent No.: US 8,237,485 B2
(45) Date of Patent: Aug. 7, 2012

(54) SYSTEM AND METHOD FOR MULTIPLE-PHASE CLOCK GENERATION

(75) Inventors: Hao Meng, Beijing (CN); Peiqi Xuan, Saratoga, CA (US)

(73) Assignee: Quintic Holdings, Santa Clara, CA (US)

( * ) Notice: Subject to any disclaimer, the term of this patent is extended or adjusted under 35 U.S.C. 154(b) by 106 days.

(21) Appl. No.: 12/872,371

(22) Filed: Aug. 31, 2010

(65) Prior Publication Data
US 2012/0007638 A1    Jan. 12, 2012

Related U.S. Application Data

(60) Provisional application No. 61/362,686, filed on Jul. 8, 2010.

(51) Int. Cl.
*G06F 1/04* (2006.01)
(52) U.S. Cl. .......................... 327/295; 327/115; 327/117
(58) Field of Classification Search .................. 327/115, 327/117, 291, 295–299
See application file for complete search history.

(56) References Cited

U.S. PATENT DOCUMENTS

| 7,102,446 | B1* | 9/2006 | Lee et al. ..................... 331/11 |
| 7,403,048 | B2* | 7/2008 | Heidari et al. ............... 327/117 |
| 7,425,850 | B2* | 9/2008 | Widerin ....................... 327/117 |
| 7,521,976 | B1* | 4/2009 | Sudjian et al. ............... 327/199 |
| 2006/0208776 | A1* | 9/2006 | Tonietto et al. ............. 327/117 |
| 2007/0009077 | A1* | 1/2007 | Widerin ....................... 377/64 |
| 2007/0241796 | A1* | 10/2007 | Sie ............................... 327/115 |

* cited by examiner

*Primary Examiner* — Lincoln Donovan
*Assistant Examiner* — William Hernandez
(74) *Attorney, Agent, or Firm* — Blairtech Solution LLC

(57) ABSTRACT

A system and method of clock generation to provide divided-by-2 clocks with prescribed phase shifts are disclosed. In a communication system with high-order harmonic mixing, the system requires LO signals with a set of prescribed phase shifts, such as 0°, 45°, 90°, and 135°, or 0°, 60° and 120°. Often, the clock generation system involves a divide-by-2 divider to derive the clock signals with the prescribed phase shifts. In a conventional implementation of the divide-by-2 divider, the system is subject to phase uncertainty in the output signal. Accordingly, a system comprises multiple latch pairs and respective differential clocks are used to generate the clocks with the set of correct prescribed phase shifts.

8 Claims, 8 Drawing Sheets

SYSTEM AND METHOD FOR MULTIPLE-PHASE CLOCK GENERATION

CROSS REFERENCE TO RELATED APPLICATIONS

The present invention is related to U.S. Provisional Patent Application, No. 61/362,686, filed Jul. 8, 2010, entitled "System and Method for Signal Mixing Based on High Order Harmonics." The U.S. Provisional Patent Application is hereby incorporated by reference in its entirety.

FIELD OF THE INVENTION

The present invention relates to clock generation system and method. In particular, the present invention relates to the clock generation system and method that provides multiple clocks with prescribed phase shifts for a high-order harmonic mixer.

BACKGROUND

In a radio frequency system, the signal to be transmitted over the radio channel is often modulated using a selected modulation method and the modulated signal is then converted to a higher frequency so as to be transmitted at a designated band. For example, in the North America, the conventional television signal is modulated using VSB modulation and the modulated television signal is up converted to VHF or UHF band for transmission. On the receiver side, the received radio frequency (RF) signal is down converted to a zero-IF, low-IF or regular IF signal for further processing. The use of down conversion in a receiver system converts the high frequency RF signal down to a lower frequency zero-IF, low-IF or IF signal. As is well known in the field of electronic circuit, a high performance circuit, such as an amplifier or a filter, is harder to implement in a higher frequency than in a lower frequency. The use of down conversion will ease the implementation of receiver circuit. Another great benefit of down conversion is that the converted zero-IF, low-IF and IF signals are more suited for digital processing where the receiver may take advantage of flexibility and programmability offered by digital signal processing. Therefore, up conversion has been widely used in a transmitter and down conversion has been widely used in a receiver. In either case, there is a need to provide a local oscillation signal to mix with the incoming signal for up conversion or down conversion.

Furthermore, the signal to be transmitted or the input signal received by a receiver may cover a wide range of frequencies. The LO circuit will have to provide LO signals over a wide range of frequencies. In order to reduce the wide tuning range, it has been described in the literature that an LO system may use higher VCO frequency followed by divide-by-4 and divide-by-6 dividers to generate differential LO signals for I and Q channels. This method can reduce the tuning range of the VCO from 100% to 50%. However, the working frequency range becomes much higher and the higher VCO frequency implies higher power consumption.

The invention disclosed in the U.S. Provisional Patent Application, No. 61/362,686, describes a high order harmonic mixing system which not only avoids the need for much higher LO frequency, but also substantially suppresses the first order and other higher order harmonics to alleviate the potential interference problem. Consequently, lower power consumption and high system performance in terms of signal-to-noise ratio (SNR) are achieved. According to the system disclosed in U.S. Provisional Patent Application, No. 61/362,686, a harmonic rejection mixer (HRM) is used to reject the interferences associated with 3rd- and 5th-order harmonic frequency. The interference signal will be converted to an IF signal if a traditional mixer is used. However, the high-order harmonic mixing system will convert the interference signal to a frequency outside the IF frequency region and consequently rejects the interference signal. In one example, the system requires LO signals with 0°, 45°, 90°, and 135° phase shifts respectively. Furthermore, the system also requires LO signals having phase shifts of 0°, 60° and 120°.

There are several circuits with different structure to generate the required clocks having the above prescribed phase shifts. For example, the LO signals with 0°, 45°, 90°, and 135° phase shifts may be generated by a circuit comprising two-stage dividers. The first stage contains a single divide-by-2 divider and the second stage contains a pair of parallelly connected divide-by-2 dividers coupled to the output of the first stage divider, and the first stage divider is driven by a differential clock having a frequency at four times the LO frequency. However, such implementation will result in phase uncertainty, which is a critical problem for the harmonic rejection mixer (HRM). A divide-by-4 divider using a differential clock will be able to provide the required clocks with the above prescribed phase shifts. However, some applications only need a divide-by-2 divider. For example, a divide-by-6 divider may be implemented as a divide-by-3 divider followed by a divide-by-2 divider. The use of a divide-by-4 divider in such case would unnecessarily increase the system cost. Therefore, it is much desired to develop systems and methods that can reliably and correctly generate a family of clocks with prescribed phase shifts.

BRIEF SUMMARY OF THE INVENTION

A system and method of clock generation for a divide-by-2 divider to generate a family of clocks with prescribed phase shifts is disclosed. The system comprises a plurality of latch pairs wherein the plurality of latch pairs is configured to form a loop comprising at least one latch pair and the system is coupled to a plurality of differential clock pairs. The plurality of differential clock pairs has the same frequency and phases of the plurality of differential clock pairs are offset by a prescribed amount. Each of the plurality of differential clock pairs is coupled to one respective latch pair of the plurality of latch pairs. In one embodiment, the loop comprises all latch pairs of the plurality of latch pairs. In yet another embodiment of the present invention, the loop comprises only one latch pair of the plurality of latch pairs and input of each of remaining latch pairs of the plurality of latch pairs is coupled to output of the latch pair in the loop. In one embodiment of the present invention, the plurality of latch pairs contains two latch pairs and the phase of the plurality of clock pairs is staggered by 90°. In yet another embodiment of the invention, the plurality of latch pairs contains three latch pairs and the phase of the plurality of clock pairs is staggered by 60°.

The method of clock generation for the divide-by-2 divider comprises providing a plurality of latch pairs; configuring the plurality of latch pairs to form a loop comprising at least one latch pair; and providing a plurality of differential clock pairs coupled to the plurality of latch pairs, wherein the plurality of differential clock pairs have the same frequency and the plurality of differential clock pairs have staggered phases; and wherein each of the plurality of differential clock pairs is coupled to one latch pair of the plurality of latch pairs.

DETAILED DESCRIPTION OF THE INVENTION

Figure 1A:
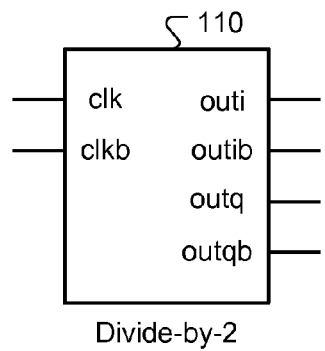
FIG. 1A illustrates a block diagram of a divide-by-2 divider having a pair of differential clock input, and a pair of differential in-phase output and a pair of differential quadrature-phase output.
Figure 1B:
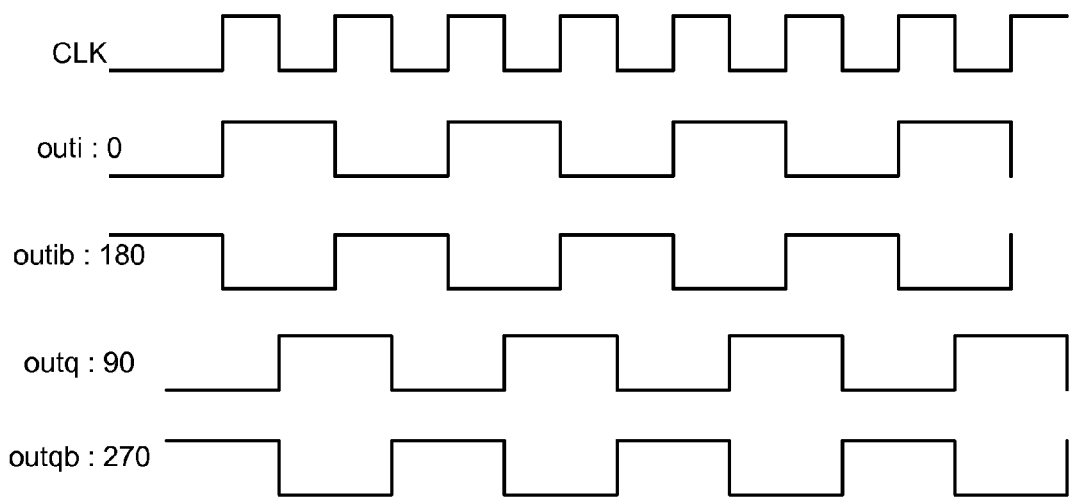
FIG. 1B illustrates clock waveforms of input and outputs of the divide-by-2 divider of FIG. 1A, where the output frequency is half of the input frequency.

FIG. 1A illustrates a block diagram of a divide-by-2 divider 110 having a pair of differential clock input, clk and clkb, and a pair of differential in-phase output, outi and outib, and a pair of differential quadrature-phase output, outq and outqb. As shown in FIG. 1B, outib is the inverted outi. In other words, outib is a 180° phase shifted version of outi. Similarly, outqb is the inverted outq. In other words, outqb is a 180° phase shifted version of outq.

Figure 1C:
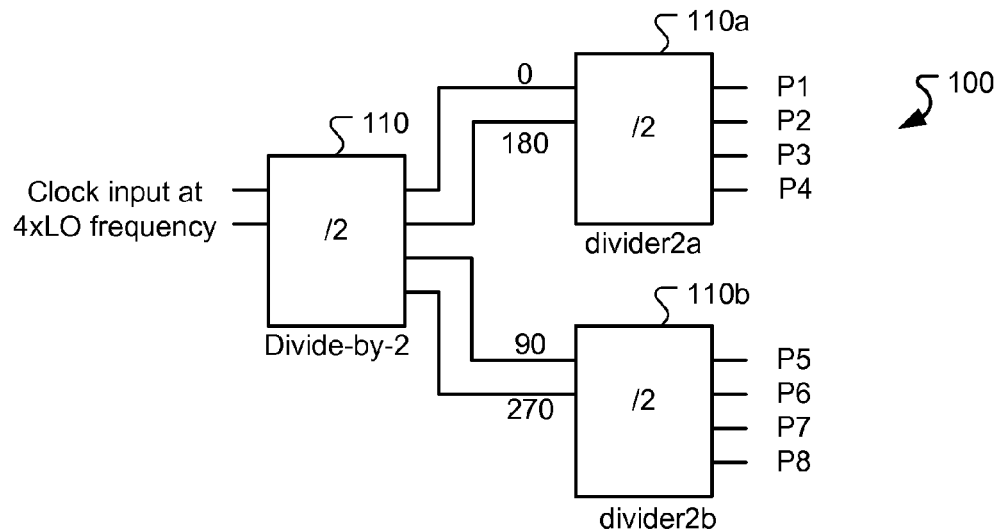
FIG. 1C illustrates a diagram of a divide-by-4 circuit based on two-stage divide-by-2 dividers using a differential clock with frequency at four times the local oscillator (LO) frequency.
Figure 1D:
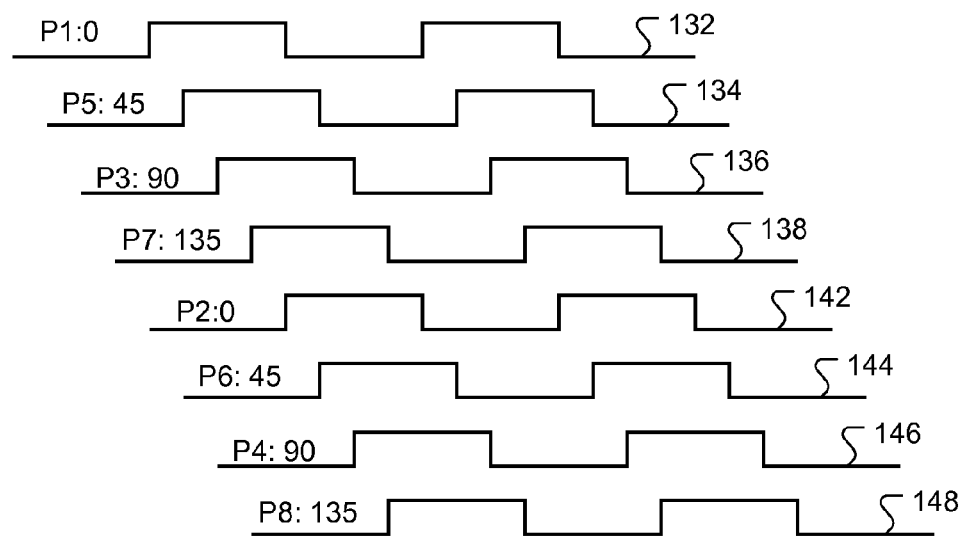
FIG. 1D illustrates a set of clock waveforms generated by the divide-by-4 circuit of FIG. 1C having the correct prescribed phase shifts.
Figure 1E:
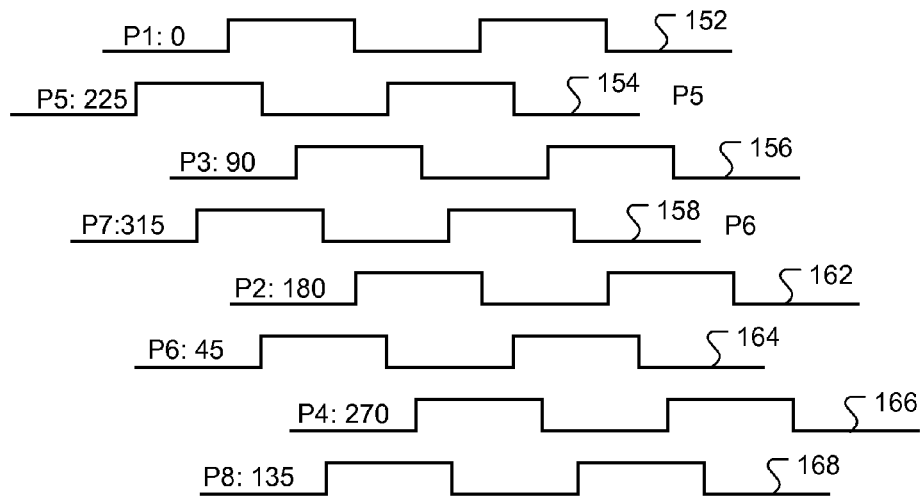
FIG. 1E illustrates a set of clock waveforms generated by the divide-by-4 circuit of FIG. 1C having an incorrect prescribed phase shifts.

FIG. 1C illustrates a block diagram of divide-by-4 clock generation using two-stage divide-by-2 dividers to provide a set of clocks with prescribed phase shifts, 0°, 45°, 90° and 135°. A pair of differential clock with a frequency at four times the local oscillator frequency is provided to the first-stage divide-by-2 divider 110. The output of the first-stage divider provides a pair of differential quadrature clock signals, i.e., 0°, 180°, 90° and 270° corresponding to I, Ī, Q and Q̄ at a frequency equal to two times the local oscillator (LO) frequency to drive the second-stage dividers 110a and 110b. The second stage divide-by-2 dividers 110a and 110b have the same characteristics except that they are operated at half of the frequency of the divide-by-2 divider 110. If the divide-by-2 divider can be designed to operate from a full frequency to a half frequency, the same divide-by-2 divider may be used for dividers 110, 110a and 110b. The outputs from the two parallelly connected dividers 110a and 110b provide the set of clock signals with prescribed phase shifts. However, the circuit according to the block diagram of FIG. 1C may cause uncertainty in the phase of the output clocks. It may generate the set of clock signals 132 through 148 having correct phase shifts as shown in FIG. 1D. However, the circuit may also generate the set of clock signals 151 through 168 having incorrect phase shifts as shown in FIG. 1E. Compared with the clock waveforms of FIG. 1D, the clocks generated by the divide-by-2 divider 110b are leading the clocks generated by the divide-by-2 divider 110a instead of lagging. The phase uncertainty will affect the proper operation of the high-order mixer as disclosed in the U.S. Provisional Patent Application, No. 61/362,686. Therefore, the phase uncertainty issue has to be resolved.

Figure 2A:
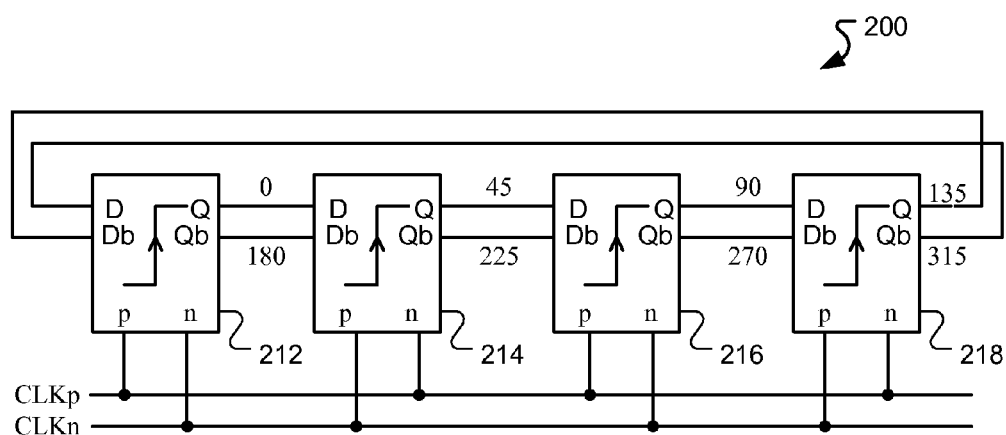
FIG. 2A illustrates a block diagram of a divide-by-4 divider that overcomes the phase uncertainty issue.
Figure 2B:
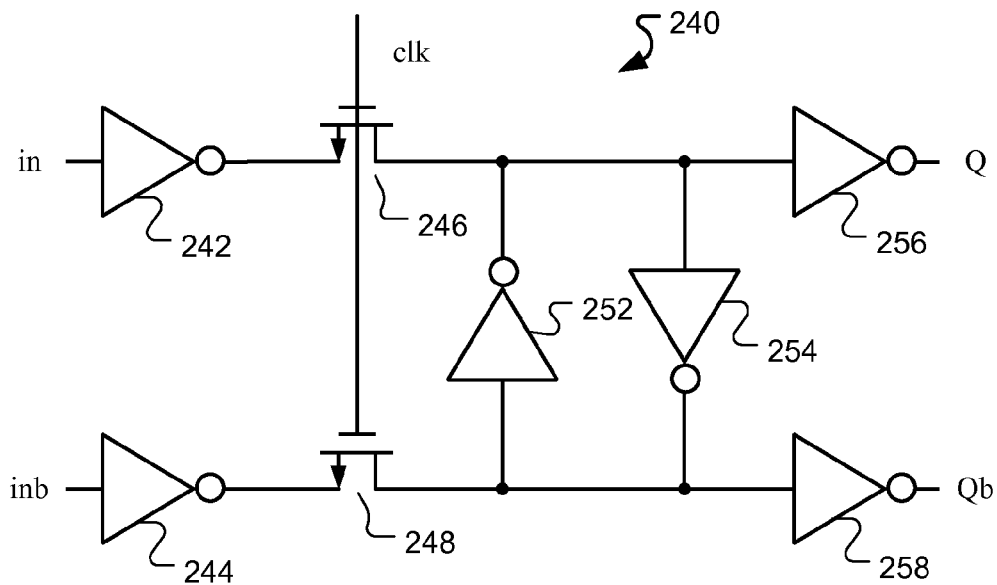
FIG. 2B illustrates an exemplary latch circuit using a single clock.
Figure 2C:
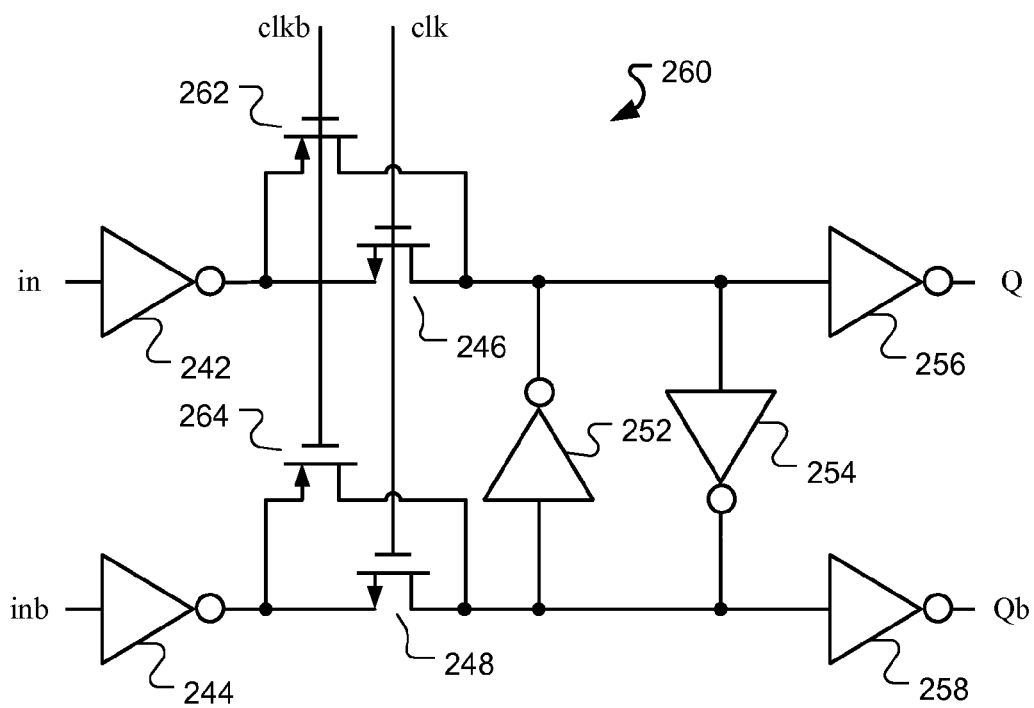
FIG. 2C illustrates an exemplary latch circuit using a differential clock.

FIG. 2A illustrates a block diagram of divide-by-4 clock generation 200 according to a prior art, wherein four latches, 212 through 218, are connected in a loop and a pair of differential clock signals are provided to all latches. While the divide-by-4 clock generation of FIG. 2A always provides a set of clock signals having the correct prescribed phase shifts, some applications only need a divide-by-2 divider. For example, a divide-by-6 divider may be implemented as a divide-by-3 divider followed by a divide-by-2 divider. The use of a divide-by-4 divider as a divide-by-2 divider in this case would unnecessarily increase the system cost. FIG. 2B illustrates an exemplary latch circuit 240 having a single clock. The input inverters 242 and 244 are coupled to the differential input in and inb. The input data is latched by a pair of transistors 246 and 248 under the control by the clk signal. The input data is latched into the storage element consisting of inverters 252 and 254. Inverters 256 and 258 are used to couple the output to Q and Qb (Q-bar) respectively. A pair of differential clock may also be used to drive the latch circuit 260 as shown in FIG. 2C, where the clock clkb is coupled to control transistors 262 and 264.

Figure 3A:
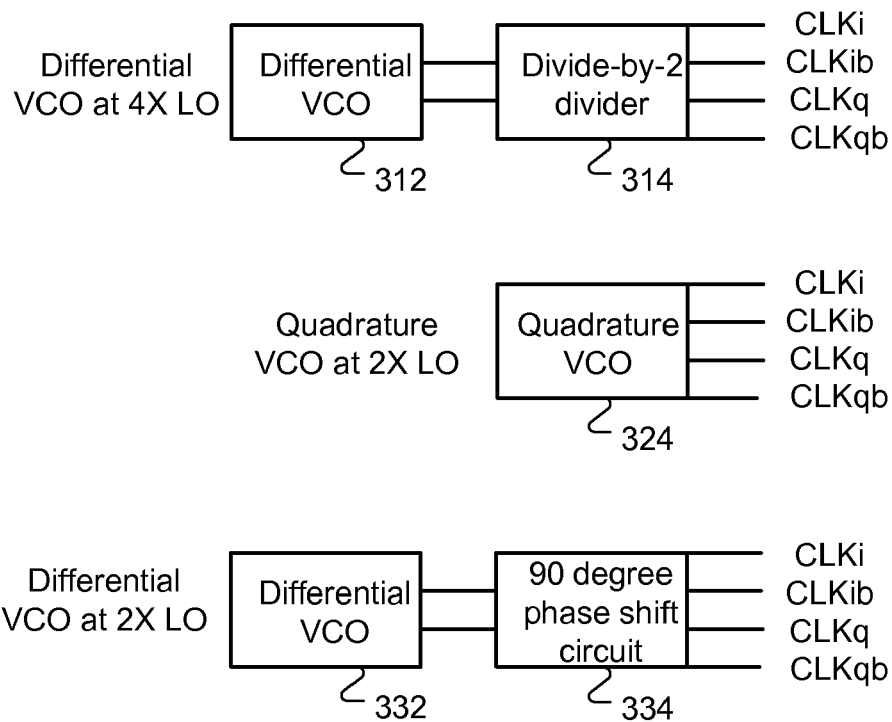
FIG. 3A illustrates block diagrams of three exemplary methods of generating clock signals having differential quadrature phases.
Figure 3B:
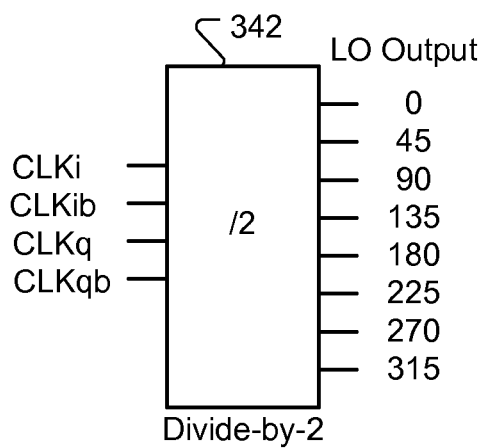
FIG. 3B illustrates block diagrams of an exemplary method of generating divide-by-2 clock signals having prescribed phase shifts corresponding to 0°, 45°, 90° and 135°.

A divide-by-2 clock generation system to provide a set of clock signals having prescribed phase shifts is shown in FIG. 3A to FIG. 3B, wherein three examples for differential quadrature clock generation are shown in FIG. 3A. The divide-by-2 clock generation system comprises two stages where the first stage provides quadrature clock signals I and Q (CLKi and CLKq in FIG. 3A) and their complementary signals, i.e., Ī and Q̄ (CLKib and CLKqb in FIG. 3A). These differential quadrature clock signals are used to drive the divide-by-2 circuit shown in FIG. 3B. These complementary quadrature clock signals have a frequency equal to two times the local oscillator frequency. Consequently, the outputs from the divide-by-2 clock generation of FIG. 3B will be at the desired LO frequency.

The first quadrature clock generation circuit comprises a differential voltage controlled oscillator (VCO) 312 and a divide-by-2 divider 314 to generate the needed differential quadrature clocks. The VCO 312 provides a differential clock signal at four times the LO frequency and the divide-by-2 divider 314 generates the in-phase and quadrature-phase clock signals at two times the LO frequency. The second quadrature clock generation circuit uses a quadrature VCO 324 to directly generate the in-phase and quadrature-phase clock signals at two times of the LO frequency. The third quadrature clock generation circuit comprises a differential VCO 332 and a phase shifter 334 to generate the in-phase and quadrature-phase clock signals at two times the LO frequency. The VCO 332 provides a differential clock signal at two times the LO frequency.

Figure 4:
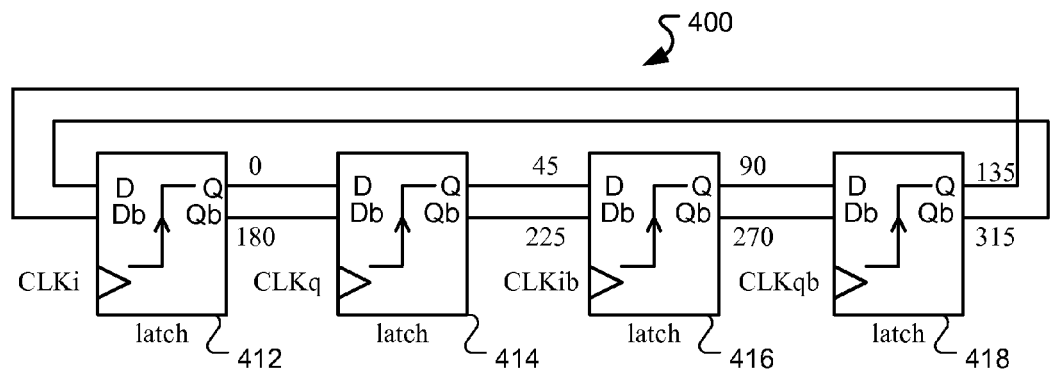
FIG. 4 illustrates an exemplary block diagram of the divide-by-2 circuit to provide clock signals with correct prescribed phase shifts corresponding to 0°, 45°, 90° and 135°.
Figure 5:
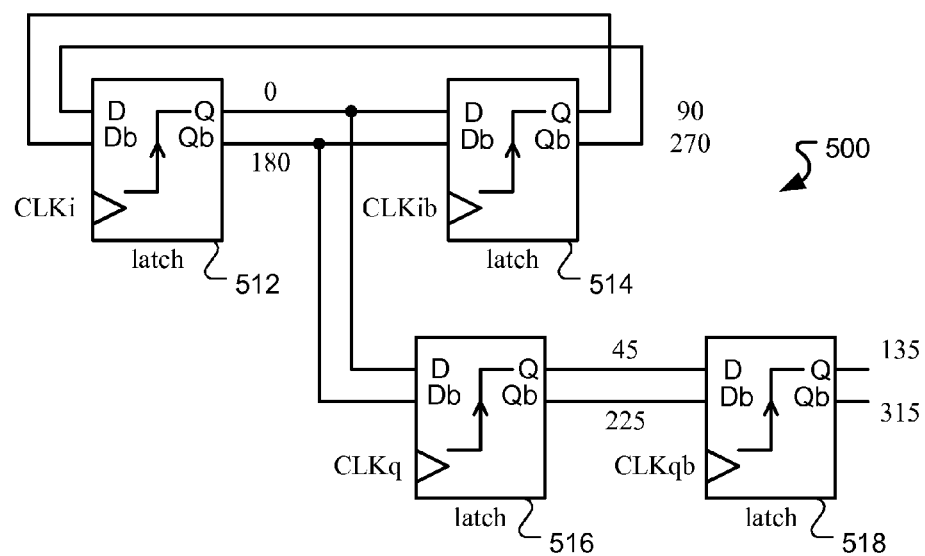
FIG. 5 illustrates an alternative exemplary block diagram of the divide-by-2 circuit to provide clock signals with correct prescribed phase shifts corresponding to 0°, 45°, 90° and 135°.

The block diagram 342 of FIG. 3B illustrates an embodiment of clock generation using a divide-by-2 divider to generate clock signals with prescribed phase shifts correctly. The divide-by-2 divider 342 uses the differential quadrature clocks, CLKi, CLKib, CLKq and CLKqb, to drive the divide-by-2 divider. Clocks CLKi and CLKq have the same frequency with phase offset by 90°. FIG. 4 and FIG. 5 illustrate two exemplary implementations of the divide-by-2 divider according the present invention. The divide-by-2 divider 400 of FIG. 4 comprises four latches 412 through 418 connected to form a loop, wherein the output of one latch is connected to the input of the next latch. The four clocks corresponding to the differential quadrature clocks are applied to four latches respectively. The phase shift of the clock at each output of the latch is labeled accordingly in FIG. 4. The system block diagram for the divide-by-2 divider of FIG. 4 generates the clock signals with prescribed phase shifts of 0°, 45°, 90° and 135°, and their respective complimentary signals correctly. FIG. 5 illustrates an alternative embodiment 500 of the clock generation according to the present invention. The clock generation 500 also comprises of four latches 512 through 518, wherein the latches 512 and 514 are connected in a loop with the output of one latch coupled to the input of the other latch. The other latch pair 516 and 518 is connected in serial, wherein the latch 518 has its input coupled to the output of the latch 516, and the latch 516 has its input coupled to the output of the latch 512. The four clocks corresponding to the differential quadrature clocks are applied to the four latches respectively, wherein differential clocks CLKi and CLKib are applied to the pair 512 and 514 connected in a loop and differential clocks CLKq and CLKqb are applied to the pair 516 and 518 connected in serial. The system block diagram for the divide-by-2 divider of FIG. 5 generates the clock signals with prescribed phase shifts of 0°, 45°, 90° and 135°, and their respective complimentary signals correctly.

While two exemplary implementation of the clock generation system according to the present invention are illustrated in FIG. 4 and FIG. 5, a skilled person in the art may also modify the system or substitute certain components to achieve the same goal of generating clocks with prescribed phases correctly. Furthermore, the divide-by-2 clock generation disclosed herein may also be modified to support a system with other frequency division. For example, in a divide-by-3 clock generation system, the clock waveforms generated may not have the desired 50% duty cycle, wherein the duty cycle is defined as the ratio of high signal period over the entire period of a clock cycle. Therefore, the system often uses a frequency twice as high as required before the divide-by-3 operation and uses a divide-by-2 divider to obtain the desired frequency while achieving the desired 50% duty cycle. For example, if a divide-by-3 frequency division is required, the system may start with a frequency at six times the LO frequency and uses a divide-by-3 divider followed by a divide-by-2 divider to generate the desired clocks.

Figure 6:
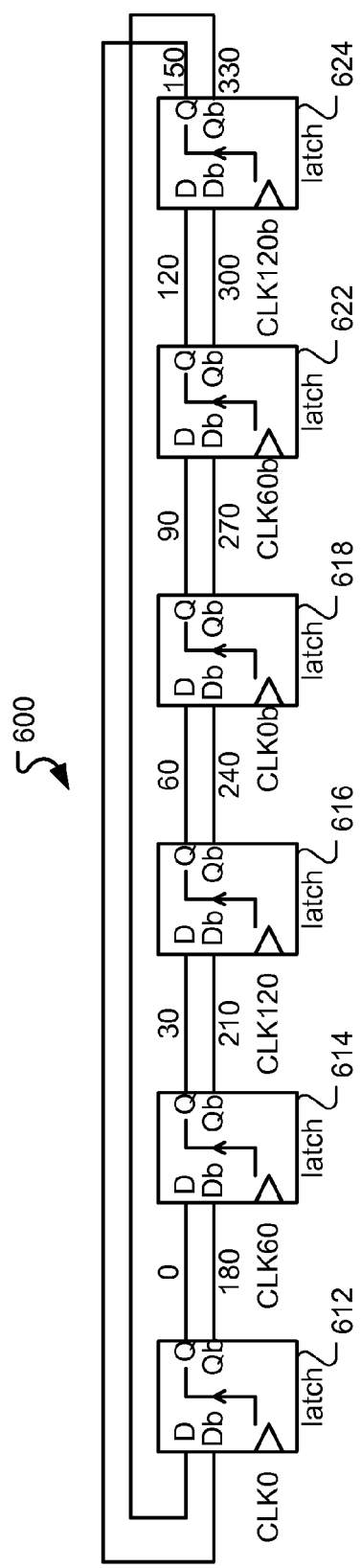
FIG. 6 illustrates an exemplary block diagram of a divide-by-2 circuit to provide clock signals with correct prescribed phase shifts corresponding to 0°, 60° and 120°.
Figure 7:
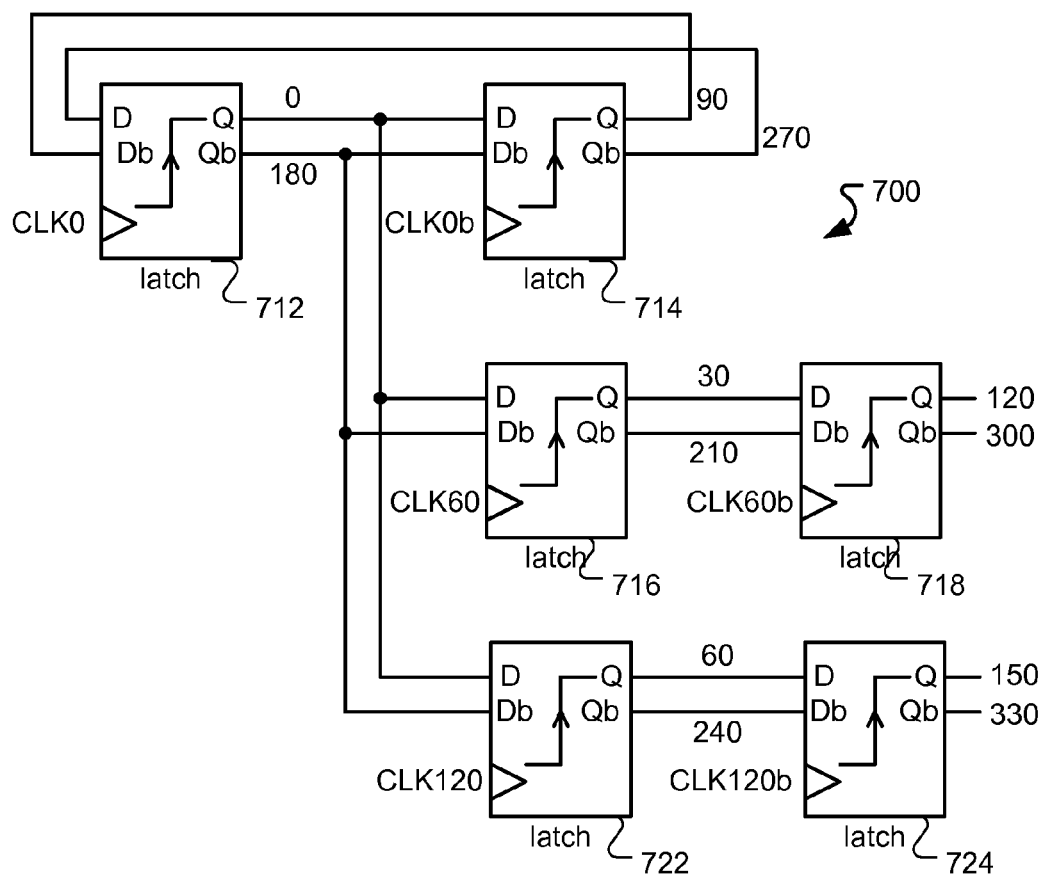
FIG. 7 illustrates an alternative exemplary block diagram of a divide-by-2 circuit to provide clock signals with correct prescribed phase shifts corresponding to 0°, 60° and 120°.

In the system disclosed in U.S. Provisional Patent Application, No. 61/362,686, the harmonic rejection mixer (HRM) is used to reject the interferences associated with the 3rd- and $5^{th}$-order harmonic frequencies, wherein the system requires an LO signal having phase shifts of 0°, 60° and 120°. FIG. 6 and FIG. 7 illustrates two exemplary implementations of the clock generation that provide clock signals having 50% duty cycle and having the correct prescribed phase shifts. The divide-by-2 divider 600 of FIG. 6 comprises six latches 612 through 624 configured to form a loop, wherein the output of one latch is connected to the input of the next latch. The six clocks, CLK0, CLK60, CLK120, CLK0b, CLK60b and CLK120b, corresponding to the differential clocks generated the divide-by-3 divider are applied to the six latches respectively. The clock signals CLK0, CLK60 and CLK120 have the same frequency with phase staggered by 60 degrees. The phase shift of the clock at each output of the latch is labeled accordingly in FIG. 6. The clock outputs for the system in FIG. 6 also have the desired 50% duty cycle.

FIG. 7 illustrates an alternative embodiment 700 of the clock generation according to the present invention. The clock generation 700 also comprises of six latches 712 through 724, wherein the latches 712 and 714 are connected in a loop with the output of one latch coupled to the input of the other latch. The latch pair 716 and 718 is connected in serial, wherein the latch 718 has its input coupled to the output of the latch 716 and the latch 716 has its input coupled to the output of the latch 712. The other latch pair 722 and 724 is connected in serial wherein the latch 724 has its input coupled to the output of the latch 722 and the latch 722 has its input coupled to the output of the latch 712. The six clocks, CLK0, CLK60, CLK120, CLK0b, CLK60b and CLK120b, corresponding to the differential clocks generated the divide-by-3 divider are applied to the six latches respectively, where differential clocks CLK0 and CLK0b are applied to pair 712 and 714 connect in a loop, and differential clocks CLK60 and CLK60b are applied to the pair 716 and 718 connected in serial, and differential clocks CLK120 and CLK120b are applied to the pair 722 and 724 connected in serial. The clock outputs for the system in FIG. 7 also have the desired 50% duty cycle.

The invention may be embodied in other specific forms without departing from its spirit or essential characteristics. The described examples are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A system for divide-by-2 clock generation comprising:
a plurality of latch pairs configured to form a loop, wherein the loop contains at least one latch pair of the plurality of latch pairs;
wherein a plurality of differential clock pairs is coupled to the plurality of latch pairs, the plurality of differential clock pairs have the same frequency, and the plurality of differential clock pairs have staggered phases;
wherein each of the plurality of differential clock pairs is coupled to one respective latch pair of the plurality of latch pairs;
wherein the loop contains all latch pairs of the plurality of latch pairs; and
wherein the plurality of the latch pairs consists of three latch pairs, and the plurality of differential clock pairs have 60-degree staggered phases.

2. A system for divide-by-2 clock generation comprising:
a plurality of latch pairs configured to form a loop, wherein the loop contains at least one latch pair of the plurality of latch pairs;
wherein a plurality of differential clock pairs is coupled to the plurality of latch pairs, the plurality of differential clock pairs have the same frequency, and the plurality of differential clock pairs have staggered phases;
wherein each of the plurality of differential clock pairs is coupled to one respective latch pair of the plurality of latch pairs; and wherein the loop contains only one latch pair of the plurality of latch pairs, and the input of each of the remaining latch pairs of the plurality of latch pairs is coupled to the output of the only one latch pair in the loop.

3. The system of claim 2, wherein the plurality of the latch pairs consists of a first latch pair and a second latch pair, wherein the first latch pair is in the loop, the plurality of differential clock pairs consists of a 0-degree differential clock pair and a 90-degree differential clock pair, and the 0-degree differential clock pair is coupled to the first latch pair and the 90-degree differential clock pair is coupled to the second latch pair.

4. The system of claim 2, wherein the plurality of the latch pairs consists of a first latch pair, a second latch pair and a third latch pair, wherein the first latch pair is in the loop, and the plurality of differential clock pairs consists of a 0-degree differential clock pair, a 60-degree differential clock pair and a 120-degree differential clock pair, the 0-degree differential clock pair is coupled to the first latch pair, the 60-degree differential clock pair is coupled to the second latch pair, and the 120-degree differential clock pair is coupled to the third latch pair.

5. A method of generating divide-by-2 clocks, the method comprising:
  providing a plurality of latch pairs;
  configuring the plurality of latch pairs to form a loop wherein the loop contains at least one latch pair of the plurality of latch pairs; and
  providing a plurality of differential clock pairs coupled to the plurality of latch pairs, wherein the plurality of differential clock pairs have the same frequency and the plurality of differential clock pairs have staggered phases;
  wherein each of the plurality of differential clock pairs is coupled to one respective latch pair of the plurality of latch pairs;
  wherein the loop contains all latch pairs of the plurality of latch pairs; and
  wherein the plurality of the latch pairs consists of three latch pairs, and the plurality of differential clock pairs have 60-degree staggered phases.

6. A method of generating divide-by-2 clocks, the method comprising:
  providing a plurality of latch pairs;
  configuring the plurality of latch pairs to form a loop wherein the loop contains at least one latch pair of the plurality of latch pairs; and
  providing a plurality of differential clock pairs coupled to the plurality of latch pairs, wherein the plurality of differential clock pairs have the same frequency and the plurality of differential clock pairs have staggered phases;
  wherein each of the plurality of differential clock pairs is coupled to one respective latch pair of the plurality of latch pairs; and
  wherein the loop contains only one latch pair of the plurality of latch pairs, and the input of each of the remaining latch pairs of the plurality of latch pairs is coupled to the output of the only one latch pair in the loop.

7. The method of claim 6, wherein the plurality of the latch pairs consists of a first latch pair and a second latch pair, the first latch pair is in the loop, the plurality of differential clock pairs consists of a 0-degree differential clock pair and a 90-degree differential clock pair, and the 0-degree differential clock pair is coupled to the first latch pair and the 90-degree differential clock pair is coupled to the second latch pair.

8. The method of claim 6, wherein the plurality of the latch pairs consists of a first latch pair, a second latch pair and a third latch pair, the first latch pair is in the loop, the plurality of differential clock pairs consists of a 0-degree differential clock pair, a 60-degree differential clock pair and a 120-degree differential clock pair, and the 0-degree differential clock pair is coupled to the first latch pair, the 60-degree differential clock pair is coupled to the second latch pair, and the 120-degree differential clock pair is coupled to the third latch pair.

* * * * *